United States Patent
Uchikawa (10) Patent No.: US 11,711,100 B2
(45) Date of Patent: Jul. 25, 2023

(54) SYNDROME CALCULATION FOR ERROR DETECTION AND ERROR CORRECTION

(71) Applicant: KIOXIA CORPORATION, Tokyo (JP)

(72) Inventor: Hironori Uchikawa, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/685,981

(22) Filed: Mar. 3, 2022

(65) Prior Publication Data

US 2023/0089702 A1    Mar. 23, 2023

(30) Foreign Application Priority Data

Sep. 22, 2021 (JP) ................. 2021-153863

(51) Int. Cl.
  *H03M 13/15* (2006.01)
  *H03M 13/11* (2006.01)
  *H03M 13/27* (2006.01)
  *H03M 13/09* (2006.01)

(52) U.S. Cl.
  CPC ........ *H03M 13/159* (2013.01); *H03M 13/098* (2013.01); *H03M 13/1177* (2013.01); *H03M 13/1575* (2013.01); *H03M 13/2732* (2013.01); *H03M 13/2735* (2013.01)

(58) Field of Classification Search
  CPC .................................................. H03M 13/159
  See application file for complete search history.

(56) References Cited

U.S. PATENT DOCUMENTS

| | | | | |
|---|---|---|---|---|
| 4,486,882 A | * | 12/1984 | Piret | G11B 20/1813 375/267 |
| 4,512,020 A | * | 4/1985 | Krol | H03M 13/13 714/781 |
| 7,089,276 B2 | | 8/2006 | Miller et al. | |
| 8,380,777 B2 | | 2/2013 | Ozturk et al. | |
| 8,453,038 B2 | | 5/2013 | Anholt | |
| 8,683,293 B2 | | 3/2014 | Saxena et al. | |
| 2012/0260144 A1 | * | 10/2012 | Varanasi | H03M 13/118 714/755 |

* cited by examiner

Primary Examiner — Joseph D Torres
(74) Attorney, Agent, or Firm — Kim & Stewart LLP (57) ABSTRACT

A syndrome calculation circuit includes a matrix product calculation circuit. The matrix product calculation circuit is configured to generate syndrome bits in a composite field by calculating a matrix product of input data bits and a first arithmetic matrix. The first arithmetic matrix is a matrix product of a basis conversion matrix for converting a data string from a Galois field to the composite field and a second arithmetic matrix, which is at least a part of a parity check matrix.

14 Claims, 6 Drawing Sheets

```
Input: s₁, s₂
Output: e₁, e₂, f_c, f_d
 1: if (s₁ == 0) then
 2:    if (s₂ == 0) then
 3:       e₁ = -1, e₂ = -1, f_c = 0, f_d = 0
 4:       return                                    # no error
 5:    else
 6:       e₁ = -1, e₂ = -1, f_c = 0, f_d = 1
 7:       return                                    # uncorrectable
 8:    end if
 9: else
10:    s_t = s₁³
11:    if (s₂ == s_t) then
12:       l₁ = loc(s₁)
13:       if (l₁ == -1) then
14:          e₁ = -1, e₂ = -1, f_c = 0, f_d = 1
15:          return                                 # uncorrectable
16:       else
17:          e₁ = l₁, e₂ = -1, f_c = 1, f_d = 1
18:          return                                 # correct 1 error
19:       end if
20:    else
21:       u = inv(s_t)s₂ + 1
22:       if (Tr(u) != 0) then
23:          e₁ = -1, e₂ = -1, f_c = 0, f_d = 1
24:          return                                 # uncorrectable
25:       else
26:          y₁ = Yu
27:          x₁ = s₁y₁
28:          x₂ = x₁ + s₁
29:          l₁ = loc(x₁)
30:          l₂ = loc(x₂)
31:          if (l₁ == -1 || l₂ == -1) then
32:             e₁ = -1, e₂ = -1, f_c = 0, f_d = 1
33:             return                              # uncorrectable
34:          else
35:             e₁ = l₁, e₂ = l₂, f_c = 1, f_d = 1
36:             return                              # correct 2 errors
37:          end if
38:       end if
39:    end if
40: end if
```

| COMPARATIVE EXAMPLE | | CIRCUITS ACCORDING TO FIRST EMBODIMENT | |
|---|---|---|---|
| $H_1$ | 285 | $H'_1$ | 281 |
| $H_2$ | 230 | $H'_2$ | 226 |
| T | 12×2 | | |
| TOTAL | 539 | TOTAL | 507 |

FIG. 8

| COMPARATIVE EXAMPLE | | CIRCUITS ACCORDING TO FIRST EMBODIMENT | |
|---|---|---|---|
| $H_1$ | 13 | $H'_1$ | 13 |
| $H_2$ | 14 | $H'_2$ | 14 |
| T | 3 | | |
| MAX | 17 | MAX | 14 |

Input: $s_1, s_2, s_c$
Output: $e_1, e_2, f_c, f_d$

```
 1: if (s₁ == 0) then
 2:    if (s₂ == 0) then
 3:       if (s_c == 0) then
 4:          e₁ = -1, e₂ = -1, f_c = 0, f_d = 0
 5:          return                                  # no error
 6:       else
 7:          e₁ = N-1, e₂ = -1, f_c = 1, f_d = 1
 8:          return                                  # correct checksum error
 9:       end if
10:    else
11:       e₁ = -1, e₂ = -1, f_c = 0, f_d = 1
12:       return                                    # uncorrectable
13:    end if
14: else
15:    if (s₂ == 0) then
16:       e₁ = -1, e₂ = -1, f_c = 0, f_d = 1
17:       return                                    # uncorrectable
18:    else
19:       u = inv(s₁s₂)
20:       if (u == 1) then
21:          if (s_c == 0) then
22:             e₁ = loc(s₁), e₂ = N-1, f_c = 1, f_d = 1
23:             return                              # correct 1 error + checksum error
24:          else
25:             e₁ = loc(s₁), e₂ = -1, f_c = 1, f_d = 1
26:             return                              # correct 1 error
27:          end if
28:       else
29:          if (Tr(u) != 0 || s_c == 1) then
30:             e₁ = -1, e₂ = -1, f_c = 0, f_d = 1
31:             return                              # uncorrectable
32:          else
33:             y₁ = Yu
34:             x₁ = s₁y₁
35:             x₂ = x₁ + s₁
36:             e₁ = loc(x₁), e₂ = loc(x₂), f_c = 1, f_d = 1
37:             return                              # correct 2 errors
38:          end if
39:       end if
40:    end if
41: end if
```

| COMPARATIVE EXAMPLE | | CIRCUITS ACCORDING TO SECOND EMBODIMENT | |
|---|---|---|---|
| $A_1$ | 11 | $A'_1$ | 16 |
| $B_1$ | 261 | $B'_1$ | 271 |
| $A_2$ | 16 | $A'_2$ | 18 |
| $B_2$ | 274 | $B'_2$ | 269 |
| T | 14 x 2 | | |
| TOTAL | 590 | TOTAL | 574 |

FIG. 13

| COMPARATIVE EXAMPLE | | CIRCUITS ACCORDING TO SECOND EMBODIMENT | |
|---|---|---|---|
| $A_1$ | 3 | $A'_1$ | 4 |
| $B_1$ | 16 | $B'_1$ | 14 |
| $A_2$ | 8 | $A'_2$ | 5 |
| $B_2$ | 15 | $B'_2$ | 17 |
| T | 4 | | |
| MAX | 20 | MAX | 17 |

SYNDROME CALCULATION FOR ERROR DETECTION AND ERROR CORRECTION

CROSS-REFERENCE TO RELATED APPLICATION

This application is based upon and claims the benefit of priority from Japanese Patent Application No. 2021-153863, filed Sep. 22, 2021, the entire contents of which are incorporated herein by reference.

FIELD

Embodiments described herein relate generally to a syndrome calculation circuit, an error-detection circuit, an error-correction circuit, and a memory system.

BACKGROUND

When correcting errors in data bits, there is a technique for basis-converting syndrome bits used for error-correction processing from Galois field representation to composite field representation.

DETAILED DESCRIPTION

Embodiments provide a syndrome calculation circuit, an error-detection circuit, an error-correction circuit, and a memory system to reduce the scale of the arithmetic circuit of the syndrome used for error-detection and error-correction processing.

In general, according to an embodiment, a syndrome calculation circuit includes a matrix product calculation circuit. The matrix product calculation circuit is configured to generate syndrome bits in a composite field by calculating a matrix product of input data bits and a first arithmetic matrix. The first arithmetic matrix is a matrix product of a basis conversion matrix for converting a data string from a Galois field to the composite field and a second arithmetic matrix, which is at least a part of a parity check matrix.

A memory system according to embodiments will be described in detail with reference to the accompanying drawings below. The present disclosure is not limited to these embodiments.

First Embodiment

Figure 1:
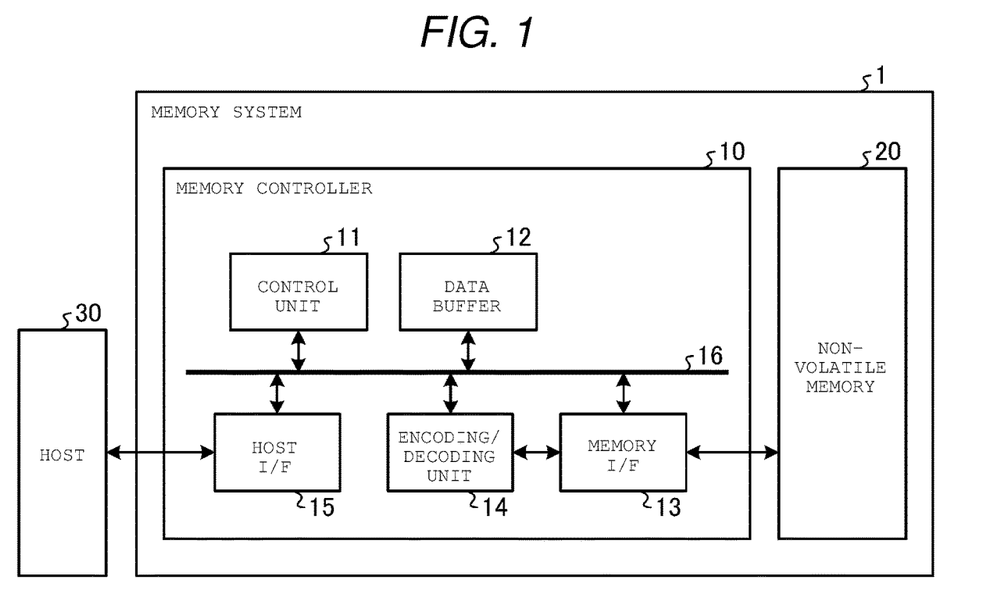
FIG. 1 is a diagram showing an example of a configuration of a memory system according to a first embodiment.

FIG. 1 is a block diagram showing a schematic configuration example of a memory system according to a first embodiment. As shown in FIG. 1, a memory system 1 includes a memory controller 10 and a non-volatile memory 20. The memory system 1 can be connected to a host 30, and FIG. 1 shows a state in which the memory system 1 is connected to the host 30. The host 30 may be, for example, an electronic device such as a personal computer or a mobile terminal.

The non-volatile memory 20 is a non-volatile memory that stores data in a non-volatile manner, and is, for example, a NAND flash memory (hereinafter, simply referred to as a NAND memory). In the following description, a case where a NAND memory is used as the non-volatile memory 20 will be illustrated, but as the non-volatile memory 20, it is also possible to use a storage device other than the NAND memory such as a three-dimensional structure flash memory, resistance random access memory (ReRAM), and ferroelectric random access memory (FeRAM). Further, the non-volatile memory 20 is not necessarily a semiconductor memory, and the present embodiment can be applied to various storage media other than the semiconductor memory.

The memory system 1 may be a memory card or the like in which the memory controller 10 and the non-volatile memory 20 are configured as one package, or may be a solid state drive (SSD) or the like.

The memory controller 10 is a semiconductor integrated circuit configured as, for example, a system-on-a-chip (SoC). A part or all of the operations of each component of the memory controller 10 described below may be implemented by a central processing unit (CPU) executing firmware, or may be implemented by hardware.

The memory controller 10 controls writing to the non-volatile memory 20 according to a write request from the host 30. Further, the memory controller 10 controls reading from the non-volatile memory 20 according to a read request from the host 30. The memory controller 10 includes a host I/F (host interface) 15, a memory I/F (memory interface) 13, a control unit 11, an encoding/decoding unit (codec) 14, and a data buffer 12. The host I/F 15, the memory I/F 13, the control unit 11, the encoding/decoding unit 14, and the data buffer 12 are connected to each other by an internal bus 16.

The host I/F 15 performs processing according to an interface standard with the host 30, and outputs a request received from the host 30, user data to be written, and the like to the internal bus 16. Further, the host I/F 15 transmits user data read from the non-volatile memory 20 and restored, a response from the control unit 11, and the like to the host 30.

The memory I/F 13 performs a write operation to write data into the non-volatile memory 20 based on an instruction of the control unit 11. Further, the memory I/F 13 performs a read operation to read data from the non-volatile memory 20 based on an instruction of the control unit 11.

The data buffer 12 temporarily stores the user data received from the host 30 by the memory controller 10 until the user data is stored in the non-volatile memory 20. Further, the data buffer 12 temporarily stores the user data read from the non-volatile memory 20 until the user data is transmitted to the host 30. For the data buffer 12, for example, a general-purpose memory such as static random access memory (SRAM) or dynamic random access memory (DRAM) may be used.

The control unit (e.g., a control circuit) 11 controls each component of the memory system 1. When the control unit 11 receives a request from the host 30 via the host I/F 15, the control unit 11 performs control according to the request. For example, the control unit 11 instructs the memory I/F 13 to write user data and parity to the non-volatile memory 20 in response to a write request from the host 30. Further, the control unit 11 instructs the memory I/F 13 to read user data and parity from the non-volatile memory 20 in response to a read request from the host 30.

Further, when the control unit 11 receives a user data write request from the host 30, the control unit 11 determines a storage area (memory area) of the non-volatile memory 20 with respect to the user data to be stored in the data buffer 12. That is, the control unit 11 manages the write destination of the user data. The correspondence between a logical address of the user data received from the host 30 and a physical address indicating the storage area of the non-volatile memory 20 in which the user data is stored is stored in, for example, the data buffer 12 as an address conversion table.

When the control unit 11 receives a read request from the host 30, the control unit 11 converts the logical address specified by the read request into a physical address by using the above-mentioned address conversion table, and instructs the memory I/F 13 to read from the physical address.

Here, in the NAND memory, writing and reading are generally performed in data units called pages, and erasing is performed in a predetermined data unit larger than a page. In the present embodiment, a plurality of memory cells connected to the same word line are referred to as memory cell groups. When the memory cell is a single level cell (SLC), one memory cell group corresponds to one page. When the memory cell is a multi-level cell (MLC), one memory cell group corresponds to a plurality of pages. In addition, each memory cell is connected to a word line and also to a bit line. Therefore, each memory cell can be identified by an address portion that identifies a word line and an address portion that identifies a bit line.

For example, when the memory cell is a 2-bit/cell memory cell, a 2-bit data value is associated with each of four threshold voltage distributions of Er, A, B, and C states. This correspondence is called data coding. Data coding is predetermined. At the time of writing (programming) data, electric charges are injected into the memory cells so as to have a state (threshold voltage distribution) corresponding to the data values to be stored according to the data coding. When a 2-bit/cell is used, one memory cell group corresponds to two pages. The 2 bits that can be stored in each memory cell correspond to these 2 pages. Hereinafter, these two pages will be referred to as a lower page and an upper page.

The user data transmitted from the host 30 is transferred to the internal bus 16 and temporarily stored in the data buffer 12. The encoding/decoding unit 14 encodes the user data stored in the non-volatile memory 20 with an error-correction code to generate coded data (codeword). Further, the encoding/decoding unit 14 decodes the coded data (also referred to as read information or received word) read from the non-volatile memory 20, and restores the user data. The data encoded by the encoding/decoding unit 14 may include control data or the like used in the memory controller 10 in addition to the user data.

During the write operation in the memory system 1 having the above configuration, the control unit 11 instructs the encoding/decoding unit 14 to encode the user data at the time of writing to the non-volatile memory 20. At that time, the control unit 11 determines a storage location (storage address) of the codeword in the non-volatile memory 20, and also instructs the memory I/F 13 of the determined storage location. The encoding/decoding unit 14 encodes the user data in the data buffer 12 with an error-correction code based on the instruction from the control unit 11 to generate a codeword. As the coding method, for example, a coding method using a low-density parity-check (LDPC) code, a Bose-Chaudhuri-Hocquenghem (BCH) code, or a Reed-Solomon (RS) code may be adopted. The memory I/F 13 operates to write the codeword to the non-volatile memory 20 based on the instruction from the control unit 11.

On the other hand, in the read operation, when reading from the non-volatile memory 20, the control unit 11 specifies an address of the non-volatile memory 20, and instructs the memory I/F 13 to read. Further, the control unit 11 instructs the encoding/decoding unit 14 to start decoding. The memory I/F 13 executes reading from the specified address of the non-volatile memory 20 according to the instruction of the control unit 11, and inputs the read information obtained by this reading to the encoding/decoding unit 14. Then, the encoding/decoding unit 14 decodes the input read information.

The encoding/decoding unit 14 may also be used, for example, as an encoding/decoding unit for each component code of a multi-dimensional error-correction code. The multi-dimensional error-correction code refers to one or more structural units of an error-correction code that are used to multi-dimensionally protect symbols representing data (e.g., user data). At that time, one symbol is composed of, for example, 1 bit (element of binary field) or an alphabetic element such as a Galois field (or also called a finite field) other than a binary field.

Figure 2:
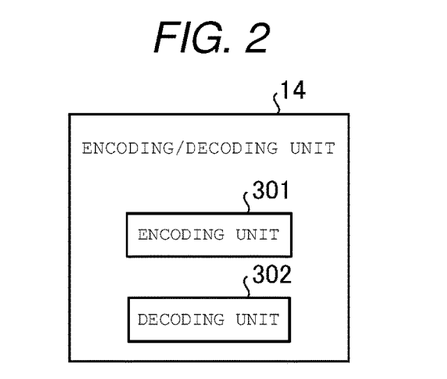
FIG. 2 is a block diagram showing an example of a functional configuration of an encoding/decoding unit according to the first embodiment.

FIG. 2 is a block diagram showing an example of the functional configuration of the encoding/decoding unit 14. As shown in FIG. 2, the encoding/decoding unit 14 includes an encoding unit (e.g., an encoding circuit) 301 and a decoding unit (e.g., a decoding circuit) 302. The encoding unit 301 executes error-correction encoding processing based on the data transferred from the internal bus 16 to generate parity, and the encoding unit 301 writes the user data and the parity to the non-volatile memory 20. Any code may be used as an error-correction code, and for example, a BCH code, a Reed-Solomon (RS) code, or the like can be used. In the following description, an example using a BCH code will be described, but the type of error-correction code is not limited thereto, and a systematic code that can separate information data and parity after encoding is preferable.

The decoding unit 302 executes decoding processing based on the user data read and the parity from the non-volatile memory 20. When there is no error in the user data, the user data read from the non-volatile memory 20 is output to the internal bus 16 as it is, and when there is an error in the user data, the user data is output to the internal bus 16 after performing error-correction using the parity. After the decoding processing is executed, the user data is output to the internal bus 16, and then transmitted to the host 30 by the control unit 11 via the host I/F 15 as a response to the read request received from the host 30, for example.

The control unit 11 instructs the encoding/decoding unit 14 to encode the data stored in the data buffer 12 with an error-correction code to generate a codeword, but the data encoded by the error-correction code may be data in which predetermined processing such as compression processing is executed on the user data. In this case, decoding processing is executed on the data read from the non-volatile memory 20 by the decoding unit 302, and the data on which the decoding processing is executed is subjected to predetermined processing such as decompression processing, and then is transmitted to the host 30 via the host I/F 15. That is, the data based on the user data may be encoded to generate a codeword and stored in the non-volatile memory 20, or decoding processing may be executed on the data read from the non-volatile memory 20, and data based on the data for which the decoding processing is executed may be transmitted to the host 30.

Figure 3:
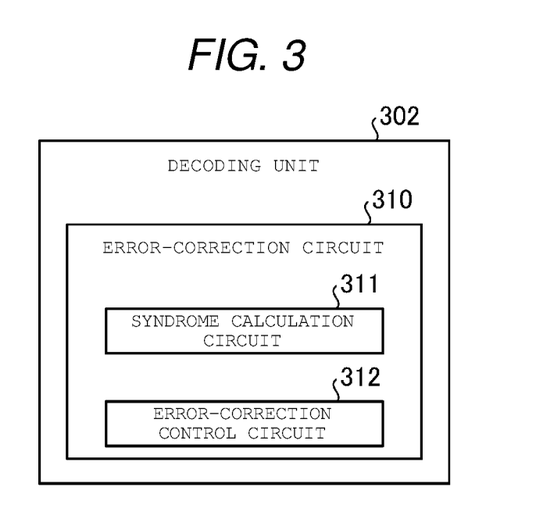
FIG. 3 is a block diagram showing an example of a functional configuration of a decoding unit according to the first embodiment.

FIG. 3 is a block diagram showing an example of a functional configuration of the decoding unit 302. As shown in FIG. 3, the decoding unit 302 includes an error-correction circuit 310. Further, the error-correction circuit 310 includes a syndrome calculation circuit 311 and an error-correction control circuit 312.

The syndrome calculation circuit 311 is a circuit that generates a syndrome from input data of a plurality of bits. The error-correction control circuit 312 specifies an error position using the syndrome.

In algebraic error-correcting codes such as BCH code and Reed-Solomon code, a decoder can execute error-correction using operations in a composite field, which is a composite representation of subfields, rather than in Galois field, in which a code is defined. This is to reduce computational complexity required for the decoding. In this case, in order to obtain the composite field representation from the Galois field representation, basis conversion is performed before and/or after the syndrome calculation, which causes an increase in the circuit size and a decrease in the operating frequency.

To address such an issue, the syndrome calculation circuit 311 according to the present embodiment has a configuration to reduce the circuit size to calculate a syndrome. Specifically, the syndrome calculation circuit 311 executes the calculation of the syndrome and the basis conversion to the composite field altogether.

Figure 4:
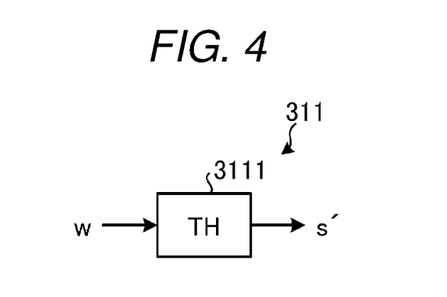
FIG. 4 is a circuit diagram of a syndrome calculation circuit according to the first embodiment.

FIG. 4 is a circuit diagram of the syndrome calculation circuit 311 according to the present embodiment. In the syndrome calculation circuit 311, a matrix product circuit 3111 executes a matrix product operation on a binary data string w having a length N and outputs a binary syndrome s' having a length k. In the matrix product circuit 3111, the binary data string w is multiplied by an arithmetic matrix H' having k rows and N columns.

The arithmetic matrix H' is the following equation (1).

$$H' = TH \quad (1)$$

T is a basis conversion matrix having k rows and k columns for conversion from the Galois field ($2^k$) to the composite field ($2^{mn}$). The Galois field ($2^k$) is a Galois extension field obtained by expanding a binary field with an irreducible polynomial of a maximum degree k on the binary field. In addition, the composite field ($2^{mn}$) is a Galois extension field obtained by expanding the Galois field ($2^m$) with an irreducible polynomial of a maximum degree n on any Galois field ($2^m$). Since k=mn, a one-to-one mapping is possible from the Galois field ($2^k$) element to the composite field ($2^{mn}$) element by using the basis conversion matrix. Since the Galois field ($2^k$) element is represented by a k binary field elements and the composite field ($2^{mn}$) element is represented by n Galois field ($2^m$) elements, both are represented by a k-bit binary vector from k=mn. H is an arithmetic matrix corresponding to a part or the entirety of a parity check matrix that defines an error-correction code. As described above, the arithmetic matrix H' is the product of the basis conversion matrix and the arithmetic matrix corresponding to a part or the entirety of the parity check matrix. Since the syndrome calculation circuit 311 according to the present embodiment executes the syndrome calculation and the basis conversion processing in a single circuit, a high-speed and small-size circuit can be implemented.

Figure 5:
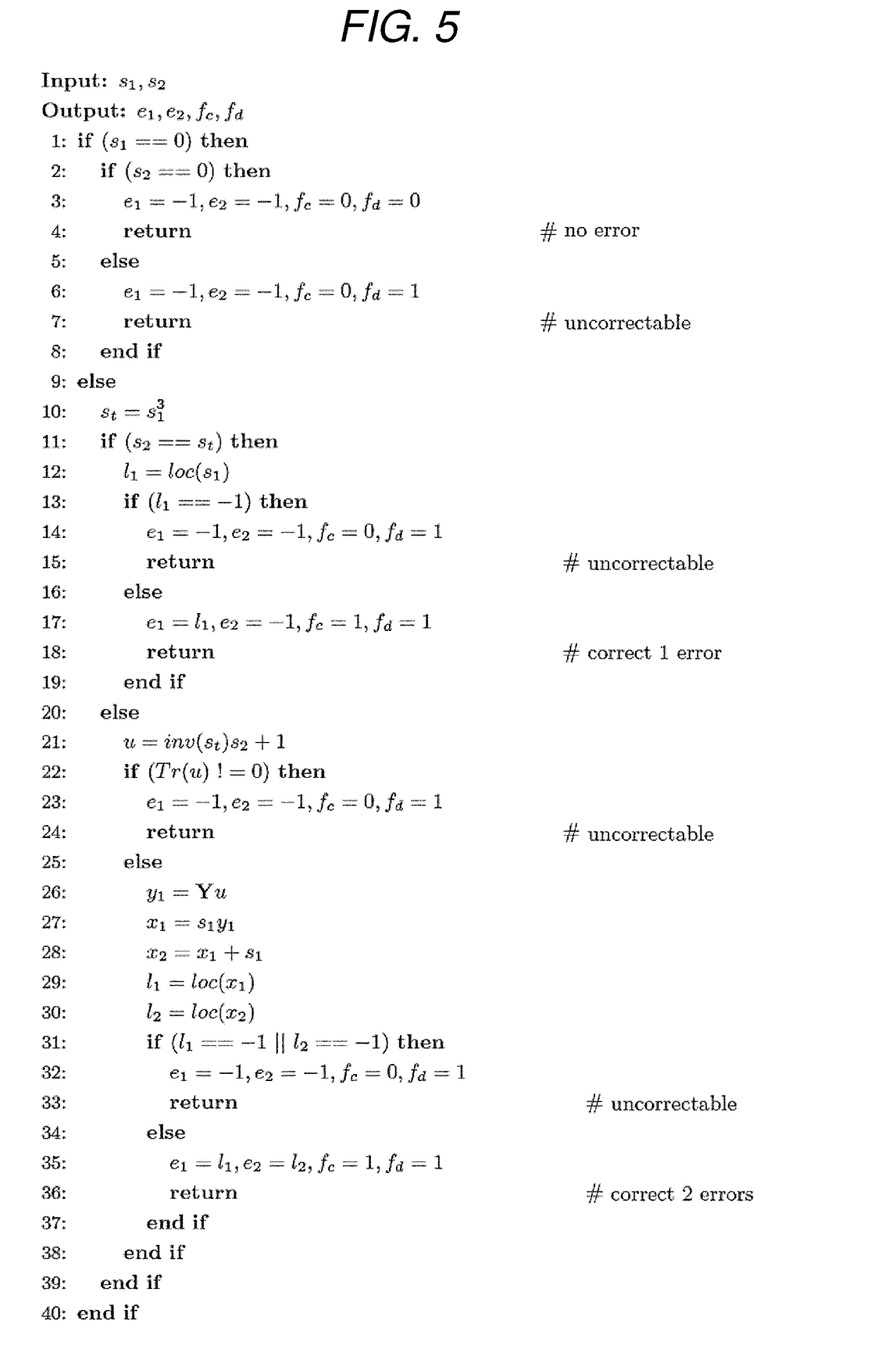
FIG. 5 is a pseudo code of an error-correction control processing procedure according to the first embodiment.

Subsequently, the detailed processing procedure of the error-correction control circuit 312 will be described by using the pseudo code of the decoding algorithm of the 2-bit correction BCH code shown in FIG. 5. In the pseudo code, '==' returns true when the left term and the right term are the same in the equivalence determination, and on the contrary, '!=' returns true when the left term and the right term are different. '=' means an assignment to the left term. The 2-bit correction BCH code of the present embodiment is defined by a generator polynomial obtained by a product of a minimal polynomial of a primitive element α of the Galois field ($2^k$) and the minimal polynomial of $α^3$. In the 2-bit correction BCH code correction circuit, two syndromes are employed and an error position is specified from the two syndromes. Two syndromes $s_1$ and $s_2$ are output by the syndrome calculation circuit 311. The outputs of the error-correction control circuit 312 are two error position indexes $e_1$ and $e_2 \in \{-1, 0, 1, 2, \ldots, N-1\}$, an error-correction flag $f_c \in \{0, 1\}$ that becomes 1 when error-correction processing is performed, and an error detection flag $f_d \in \{0, 1\}$ that becomes 1 when an error is detected. Since an error is always detected when the error is corrected, $f_d=1$ always when $f_c=1$. Since N is the total length of data and parity and the effective index is 0 to N−1, index−1 is an invalid return value returned when there is no error or the error is uncorrectable.

The error-correction control circuit 312 determines whether or not there is an error and whether or not the error can be corrected based on the syndromes $s_1$ and $s_2$. The error-correction control circuit 312 determines that there is no error when both $s_1$ and $s_2$ are 0 (1st to 4th lines of the pseudo code).

In the error-correction control circuit 312, when $s_1=0$ and $s_2$ is not 0, it is determined that the error is uncorrectable because an error of 3 bits or more has occurred. That is, the error-correction control circuit 312 does not make corrections with $f_c=0$ and $f_d=1$ (5th to 7th lines of the pseudo code).

Error-correction processing is performed after the 10th line of the pseudo code. First, the error-correction control circuit 312 calculates $s_t$ obtained by cubing the error-correction $s_1$ (10th line of the pseudo code). When $s_3=s_t$, since the error is a 1-bit error or an error of 3 bits or more, the error-correction control circuit 312 can obtain an error position by using a position conversion operation loc for obtaining the error position from the element of the composite field ($2^{mn}$) and a syndrome $s_1$ (12th line of the pseudo code). The position conversion operation loc returns −1 when an error position cannot be obtained (when there is an error of 3 bits or more). Thus, when the position conversion operation loc returns −1, the error-correction control circuit 312 determines that the error is uncorrectable, and makes no correction with $f_c=0$ and $f_d=1$ (13th to 15th lines of the pseudo code).

On the other hand, when an error position is obtained by the position conversion operation loc, the error-correction control circuit 312 returns the bit position as an error position together with $f_c=1$ and $f_d=1$ (16th to 18th lines of the pseudo code).

From the 20th line onward, a 2-bit error or 3-bit or more processing is performed. The error-correction control circuit 312 determines that the error is uncorrectable when a trace Tr(u) of u obtained by the calculation on the 21st line is other than 0 (22nd to 24th lines of the pseudo code). Tr(u) on the 22nd line is a trace function that maps the element u of the composite field ($2^{mn}$) to the element of the binary field. inv(x) is a function that returns the inverse element of x.

When Tr (u) is 0, the processing from the 25th line onward is performed as a 2-bit error. Y on the 26th line is a binary matrix having k rows and k columns. The position conversion operation loc is used to find the error position on the 29th and 30th lines. When either one has an invalid value of −1, an error of 3 bits or more has occurred and no error correction is performed (31st to 33rd lines of the pseudo code).

As the hardware configuration of the error-correction control circuit 312, a sequential circuit can be employed. The sequential circuit calculates values such as $s_t$, u, loc($s_1$), loc($x_1$), and loc($x_2$) according to the inputs $s_1$ and $s_2$ and selects the output value with a 7-bit combination logic of $s_1=0$, $s_2=0$, $s_2=s_t$, Tr(u), loc($s_1$)=−1, loc($x_1$)=−1, and loc($x_2$)=−1.

When $s_1=0$ (there is no error or the error is uncorrectable), the calculation after the 10th line of the pseudo code is unnecessary, and when $s_2=s_t$ (1-bit error or the error is uncorrectable, the calculation after the 20th line of the pseudo code is unnecessary. Therefore, when it is expected that the probability of error occurrence is very low as in SDRAM, the error-correction control circuit 312 can minimize average power consumption by activating the calculations on the 10th and 20th lines of the pseudo code as needed. The error-correction control circuit 312 can generate one-hot vectors each having the length N in which only the indexes of $e_1$ and $e_2$ are 1 for the bit inversion of error-correction and correct errors by adding the vector to a binary data string w input to the error-correction circuit 310 (exclusive OR).

Figure 6:
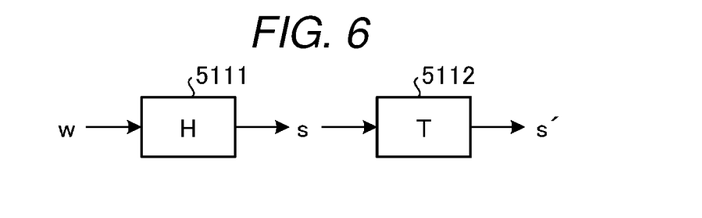
FIG. 6 is a circuit diagram of a syndrome calculation circuit according to a comparative example of the first embodiment.

As a comparative example with respect to the syndrome calculation circuit 311 according to the present embodiment, it is conceivable to implement the syndrome calculation and the basis conversion processing in separate circuits. A circuit diagram of the syndrome calculation circuit according to the comparative example is shown in FIG. 6. As shown in FIG. 6, the syndrome calculation circuit according to the comparative example includes a parity check matrix calculation circuit 5111 and a basis conversion calculation circuit 5112.

In the syndrome calculation circuit according to the comparative example, when the binary data string w is input to the parity check matrix calculation circuit 5111, the parity check matrix calculation circuit 5111 outputs a syndrome s, which is the result of calculating the product of the binary data string w and the parity check matrix. This syndrome s is a syndrome of Galois field ($2^k$) representation.

When the syndrome s is input to the basis conversion calculation circuit 5112, the basis conversion calculation circuit 5112 outputs the syndrome s' which is the result of calculating the product of the syndrome s and the basis conversion matrix. This syndrome s' is a syndrome of composite field ($2^{mn}$) representation.

In the syndrome calculation circuit according to the comparative example, the syndrome calculation and the basis conversion processing are implemented in separate circuits. In contrast, in the syndrome calculation circuit 311 according to the present embodiment, as shown in FIG. 4, two kinds of processing are performed altogether in a single circuit, a high-speed and small-scale circuit can be implemented.

Figure 7:
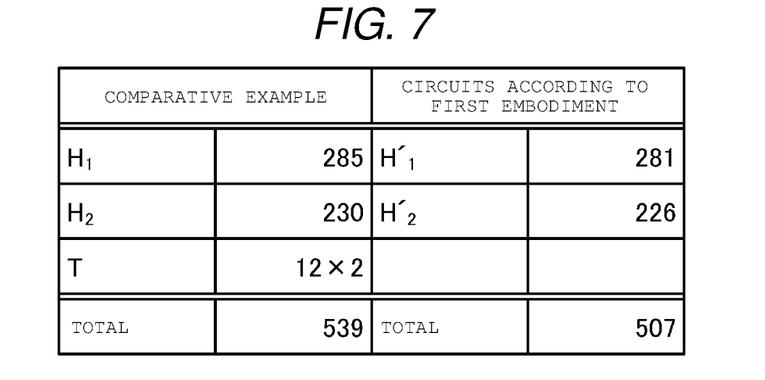
FIG. 7 is a comparison table of the number of XOR gates required for syndrome calculation.
Figure 8:
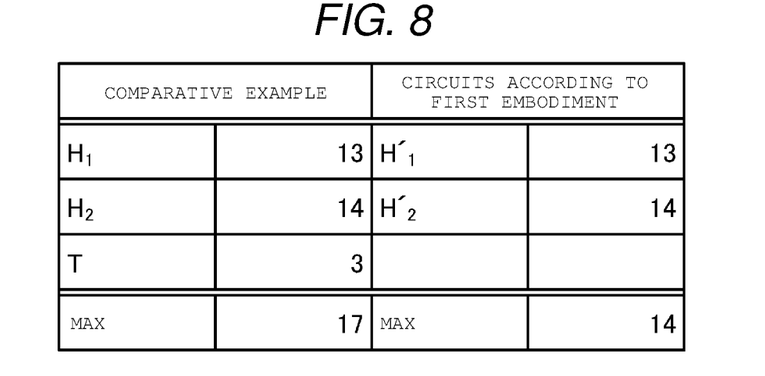
FIG. 8 is a comparison table of the number of XOR stages required for syndrome calculation.

FIG. 7 shows a table of the number of XOR (exclusive OR) gates required when a 2-bit correction BCH code syndrome calculation circuit having a code length N=144 is implemented. FIG. 8 shows a table of the maximum number of stages of XOR required when the syndrome calculation circuit of the 2-bit correction BCH code also having the code length N=144 is implemented.

In the 2-bit correction BCH code correction circuit, two syndromes are calculated. To calculate the two syndromes, arithmetic matrices $H_1$ and $H_2$ corresponding thereto are required. In addition, since two basis conversion circuits T that convert the two syndromes obtained using $H_1$ and $H_2$ are required, the total number of XOR gates required in implementation of such a circuit is 539.

On the other hand, in the syndrome calculation circuit 311 according to the present embodiment, the total number of XOR gates corresponding to calculation using the arithmetic matrices $H'_1$ and $H'_2$ for the two syndromes is 507. That is, the syndrome calculation can be implemented in a smaller scale than the syndrome calculation circuit according to the comparative example.

Further, comparing the maximum number of XOR stages in the circuit (maximum number of XOR gates passing through the circuits from circuit input to circuit output) related to the calculation speed of the circuits with reference to FIG. 8, the syndrome calculation circuit according to the comparative example requires 17 gates. This is because the maximum value of the arithmetic matrices $H_1$ and $H_2$ and the three gates of a basis conversion matrix T are required. In the syndrome calculation circuit 311 according to the present embodiment, the number of gates can be reduced to 14. By configuring the syndrome calculation circuit 311 according to the present embodiment in this manner, a small-scale and high-speed syndrome calculation circuit can be implemented.

In the present embodiment, a syndrome calculation circuit of a BCH code having symbols on a binary field is described as an example for simplification of description, but a syndrome calculation circuit of an error-correction code defined by a finite field polynomial such as a Reed-Solomon code may be used.

In the above description, in the syndrome calculation circuit 311, the product operation using the product matrix of the basis conversion matrix and the arithmetic matrix corresponding to a part or the entirety of the parity check matrix is executed on the binary data string w to output the binary syndrome s'.

As described above, since the syndrome calculation circuit 311 collectively executes the syndrome calculation and the basis conversion processing to the composite field in a single circuit, a high-speed and small-scale circuit can be implemented.

Further, the error-correction control circuit 312 detects an error position by using the syndrome s' output by the syndrome calculation circuit 311. In this case, in the error-correction circuit 310, the syndrome calculation circuit 311 has high speed and the circuit size is reduced, and therefore the high-speed and small-scale error-correction circuit 310 can also be implemented.

Second Embodiment

Subsequently, a memory system 1 according to a second embodiment will be described. In the syndrome calculation circuit of the memory system 1 according to the second embodiment, input data is sequentially calculated. Since the memory system 1 according to the second embodiment is common to the memory system 1 according to the first embodiment except for the syndrome calculation circuit and the error-correction control circuit, the syndrome calculation circuit and the error-correction control circuit will be mainly described.

Figure 9:
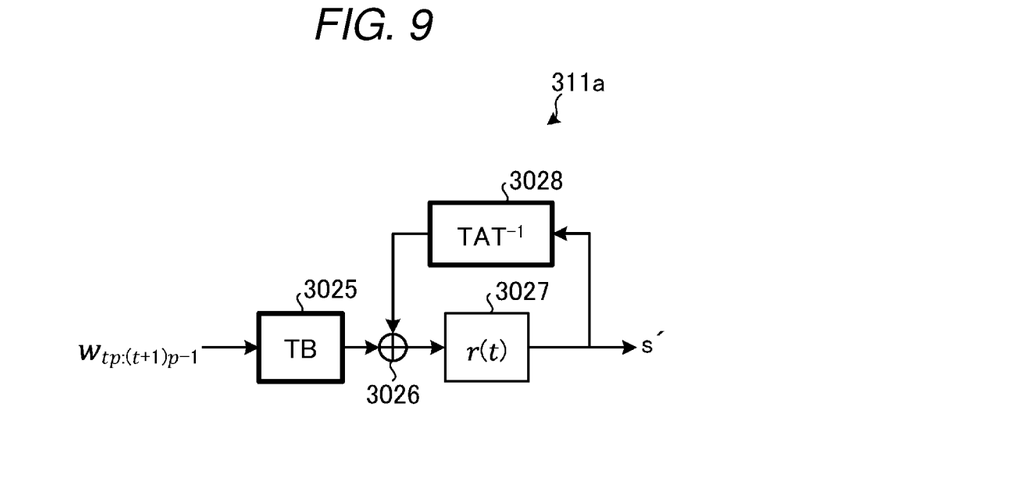
FIG. 9 is a circuit diagram of a syndrome calculation circuit according to a second embodiment.

FIG. 9 shows a circuit diagram of a syndrome calculation circuit 311a according to the second embodiment. The syndrome calculation circuit 311a according to the second embodiment includes a first matrix product circuit 3025, an adder circuit 3026, a register 3027, and a second matrix product circuit 3028.

The first matrix product circuit 3025 multiplies an input data chunk $w_{tp:\ (t+1)p-1}$ having a length p by TB, which is an arithmetic matrix B', and outputs first intermediate data having the length k to the adder circuit 3026. $w_{tp:\ (t+1)p-1}$ indicates a bit string from a tp bit to (t+1)p−1. t is a chunk index of 0, 1, . . . , (N/p)−1, and p is the number of simultaneous input bits. The matrix T is a basis conversion matrix having k rows and k columns for conversion from the Galois field ($2^k$) to the composite field ($2^{mn}$). The arithmetic matrix B is a matrix having k rows and p columns, and is a part of the parity check matrix.

The data chunk having the length p input to the first matrix product circuit 3025 is a data chunk $w_{tp:\ (t+1)p-1}$ with t=0, 1, . . . , (N/p)−1, in which a binary data string w having the length N that may contain an error is divided for each p bits. After $w_{tp:\ (t+1)p-1}$ is input for each clock cycle and all data chunks are input over N/p cycles, the binary syndrome s' having the length k is output in the next cycle.

The adder circuit 3026 is a circuit that calculates an exclusive OR of the elements of the first intermediate data having the length k, which is the output of the first matrix product circuit 3025, and second intermediate data having the length k, which is the output from the second matrix product circuit 3028, and outputs third intermediate data to the register 3027.

The register 3027 stores the third intermediate data having the length k output from the adder circuit 3026 until the next clock cycle, and outputs the stored data to the second matrix product circuit and the processing block in the subsequent stage as fourth intermediate data in the next clock cycle.

The second matrix product circuit 3028 multiplies the fourth intermediate data having the length k output from the register 3027 by an arithmetic matrix A', and outputs the second intermediate data having the length k to the adder circuit 3026.

The arithmetic matrix A' is the following equation (2).

$$A' = TAT^{-1} \quad (2)$$

The matrix T is a basis conversion matrix having k rows and k columns for conversion from the Galois field ($2^k$) to the composite field ($2^{mn}$). A matrix A is a shift matrix having k rows and k columns, and corresponds to the multiplication of the elements of the p-th power of the primitive elements on the Galois field ($2^k$). A matrix $T^{-1}$ is a basis conversion matrix (inverse matrix of the matrix T) for conversion from the composite field ($2^{mn}$) to the Galois field ($2^k$).

Figure 10:
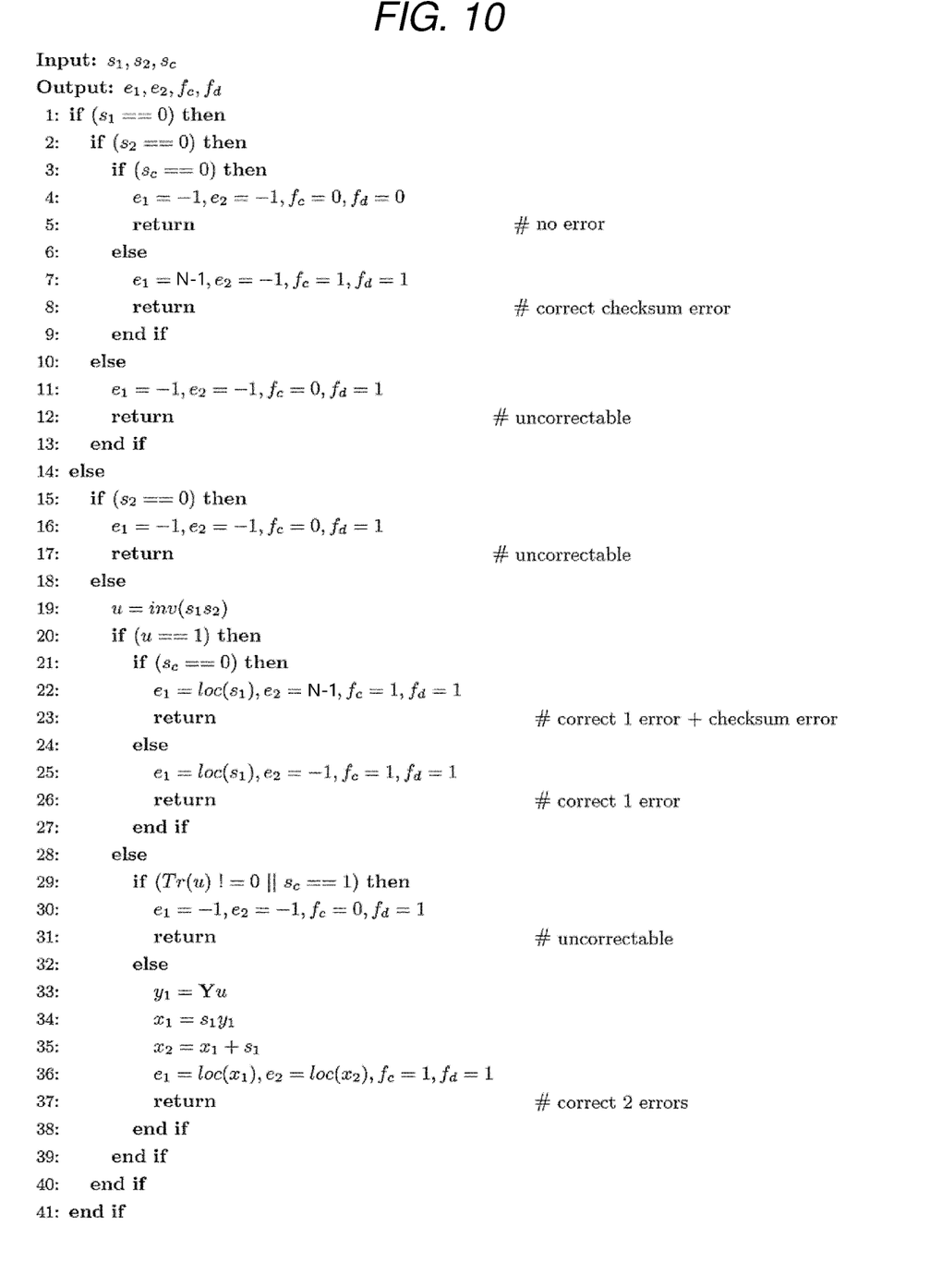
FIG. 10 is a pseudo code of an error-correction control processing procedure according to the second embodiment.

Subsequently, the processing content of the error-correction control circuit 312 according to the second embodiment will be described by using a pseudo code of the decoding algorithm of the 2-bit correction and extended BCH code having the code length N shown in FIG. 10. It is assumed that the 2-bit correction and extended BCH code of the present embodiment is defined by the generator polynomial obtained by the product of the minimal polynomial of the primitive element α of the Galois field ($2^k$), the minimal polynomial of the inverse element $\alpha^{-1}$ of the primitive element α, and the polynomial (x+1) for a single parity check (check sum).

In the 2-bit correction and extended BCH code correction circuit, three syndromes are calculated. The inputs are three syndromes $s_1$, $s_2$, and $s_c$ obtained by the syndrome calculation. $s_c$ is a single parity check (checksum) syndrome. The outputs are two error position indexes $e_1$ and $e_2 \in \{-1, 0, 1, 2, \ldots, N-1\}$, an error-correction flag $f_c \in \{0, 1\}$ that becomes 1 when error-correction processing is performed, and an error detection flag $f_d \in \{0, 1\}$ that becomes 1 when an error is detected. Since an error is always detected when the error is corrected, $f_d=1$ always when $f_c=1$.

Since the effective index is 0 to N−1, the index−1 is an invalid return value returned when there is no error or the error is uncorrectable. The error-correction control circuit 312 can determine whether or not there is an error and whether or not the error can be corrected based on the syndromes $s_1$ and $s_2$. Because there is no error in the part other than a checksum $r_c$ when both $s_1$ and $s_2$ are 0, the error-correction control circuit 312 corrects the checksum according to the value of a syndrome $s_c$ (3rd to 9th lines of the pseudo code).

On the other hand, when either $s_1$ or $s_2$ is 0 and the other is non-zero, the error-correction control circuit 312 determines that the error is uncorrectable because an error of 3 bits or more has occurred. That is, the error-correction control circuit 312 does not make corrections with $f_c=0$ and $f_d=1$ (10th to 17th lines of the pseudo code).

It is possible to correct errors that occur in other than $r_c$ when both $s_1$ and $s_2$ are non-zero values (after the 18th line of the pseudo code). Inv (x) on the 19th line of the pseudo code is a function that returns the inverse element of x, and when u=inv($s_1s_2$) is 1, the number of errors other than $r_c$ is processed as 1 (20th to 27th lines of the pseudo code). Since inv(u)=1 when u=1, the error-correction control circuit 312 executes the condition determination on the 20th line with $s_1s_2$ instead of u. loc(x) is a position conversion operation that calculates the index of the error position calculated from x. Tr(u) on the 29th line of the pseudo code is a trace function that maps the element u of the composite field ($2^{mn}$) to the element of the binary field. Y in the 33rd line is a binary matrix having k rows and k columns.

As the hardware configuration of the error-correction control circuit 312, a sequential circuit can be employed. The sequential circuit calculates values such as u, loc($s_1$), loc($x_1$), and loc($x_2$) according to the inputs $s_1$, $s_2$, and $s_c$ and selects the output value with 5 bits of $s_1$=0, $s_2$=0, $s_c$, u=1, and Tr(u). When both $s_1$ and $s_2$ are not non-zero, the calculation after the 18th line of the pseudo code is unnecessary. Therefore, when it is expected that the probability of error occurrence is very low as in SDRAM, the error-correction control circuit 312 can minimize the average power consumption by implementing the error-correction control circuit 312 to be activated only when both $s_1$ and $s_2$ are non-zero when the calculation after the 18th line of the pseudo code is performed. Further, the error-correction control circuit 312 can generate one-hot vectors each having the length N in which only the indexes of $e_1$ and $e_2$ are 1 for the bit inversion of error-correction and correct errors by adding the vector to a binary data string w input to the error-correction circuit 310 (e.g., exclusive OR).

Figure 11:
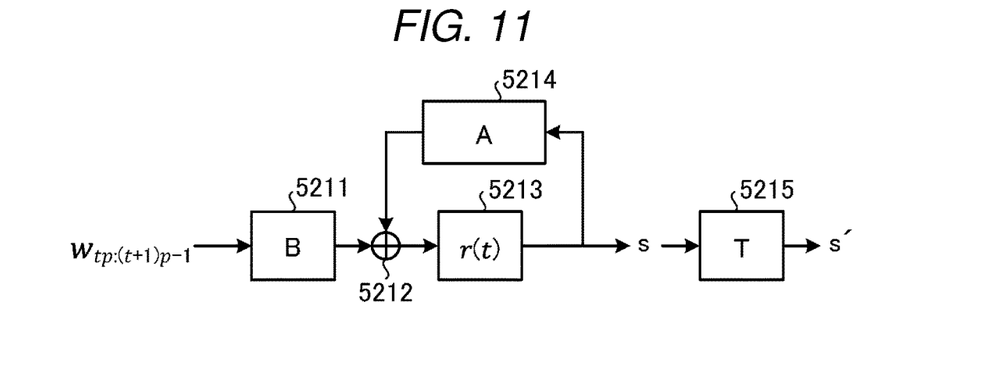
FIG. 11 is a circuit diagram of a syndrome calculation circuit according to a comparative example of the second embodiment.

As a comparative example of this technique, it is conceivable to implement the syndrome calculation and the basis conversion processing in separate circuits. A circuit diagram of the syndrome calculation circuit according to the comparative example is shown in FIG. 11. As shown in FIG. 11, the syndrome calculation circuit according to the comparative example includes a first matrix product circuit 5211, an adder circuit 5212, a register 5213, a second matrix product circuit 5214, and a third matrix product circuit 5215.

The first matrix product circuit 5211 multiplies the data chunk having the length p by the arithmetic matrix B, and outputs the first intermediate data having the length k to the adder circuit 5212. The arithmetic matrix B is a matrix having k rows and p columns, and is a part of the parity check matrix.

The adder circuit 5212 is a circuit that calculates the exclusive OR of the elements of the first intermediate data having the length k, which is the output of the first matrix product circuit 5211, and second intermediate data having the length k, which is the output from the second matrix product circuit 5214, and outputs third intermediate data to the register 5213.

The register 5213 stores the third intermediate data having the length k output from the adder circuit 5212 until the next clock cycle and outputs the stored data to the second matrix product circuit 5214 and the third matrix product circuit 5215, which is the processing block in the subsequent stage, as fourth intermediate data in the next clock cycle.

The second matrix product circuit 5214 multiplies the fourth intermediate data having the length k output from the register 5213 by the shift matrix A having k rows and k columns, and outputs the second intermediate data having the length k to the adder circuit 5212.

The data output by the register 5213 to the processing block in the subsequent stage is the syndrome s. This syndrome s is a syndrome of Galois field ($2^k$) representation. When the syndrome s is input to the third matrix product circuit 5215, the third matrix product circuit 5215 outputs the syndrome s' which is the result of calculating the product of the syndrome s and the basis conversion matrix. This syndrome s' is a syndrome of composite field ($2^{mn}$) representation.

In the syndrome calculation circuit according to the comparative example, the syndrome calculation and the basis conversion processing are implemented in separate circuits. In contrast, in the syndrome calculation circuit 311a according to the present embodiment, as shown in FIG. 9, two kinds of processing are collectively performed, a high-speed and small-scale circuit can be implemented.

Figure 12:
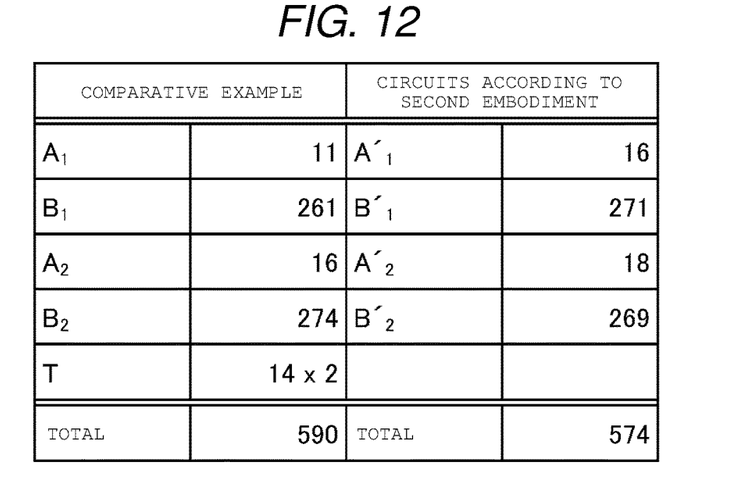
FIG. 12 is a comparison table of the number of XOR gates required for syndrome calculation.
Figure 13:
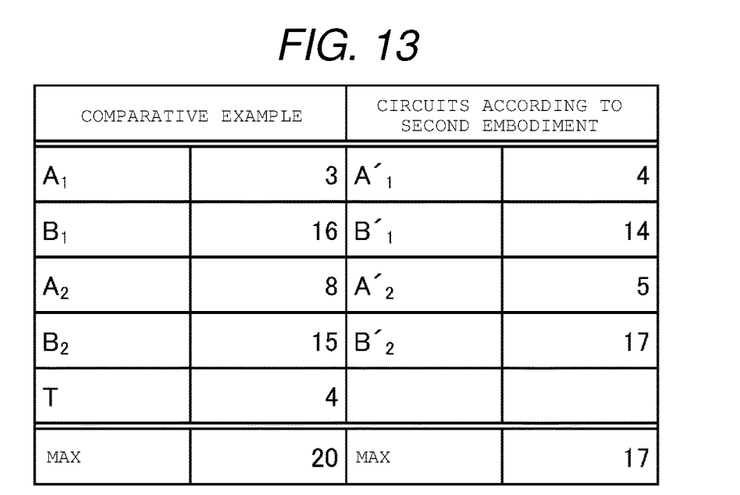
FIG. 13 is a comparison table of the number of XOR stages required for syndrome calculation.

FIG. 12 shows a table of the number of XOR (exclusive OR) gates required when a 2-bit correction and extended BCH code syndrome calculation circuit having a code length N=512 is implemented. FIG. 13 shows a table of the number of stages of XOR required when the syndrome calculation circuit of the 2-bit correction and extended BCH code also having the code length N=512 is implemented.

In the 2-bit correction BCH code correction circuit, since two syndromes are calculated, arithmetic matrices $A_1$, $A_2$, $B_1$, and $B_2$ corresponding to each are required. Further, since two basis conversion circuits T for calculating the syndromes obtained in each of the arithmetic matrices $A_1$, $A_2$, $B_1$, and $B_2$ are required, the total number of XOR gates required for implementation is 590.

On the other hand, in the syndrome calculation circuit 311a according to the present embodiment, the total number of XOR gates of the arithmetic matrices $A'_1$, $A'_2$, $B'_1$, and $B'_2$ corresponding to each of the two syndromes is 574. That is, the syndrome calculation can be implemented on a smaller scale than the syndrome calculation circuit according to the comparative example.

Further, comparing the maximum number of XOR stages required in the circuit (maximum number of XOR gates passing through the circuit from circuit input to circuit output) related to the calculation speed of the circuit with reference to FIG. 13, the syndrome calculation circuit according to the comparative example requires 20 gates. This is the sum of the maximum value of 16 gates of the arithmetic matrices $A_1$, $A_2$, $B_1$, and $B_2$ and the 4 gates of the basis conversion circuit T. On the other hand, since the syndrome calculation circuit 311a according to the present embodiment requires 17 gates, the number of gates in the syndrome calculation circuit 311a according to the present embodiment can be reduced as compared with the syndrome calculation circuit according to the comparative example. By configuring the syndrome calculation circuit 311a according to the present embodiment in this manner, a small-scale and high-speed syndrome calculation circuit can be implemented.

In the above description, in addition to the first matrix product circuit 3025, the syndrome calculation circuit 311a includes the adder circuit 3026, the register 3027, and the second matrix product circuit 3028 that performs the matrix product operation of three matrix products of the basis conversion matrix, the shift matrix, and the basis conversion matrix from the composite field to the Galois field.

In this case, in the second matrix product circuit 3028, the shift processing and the basis conversion processing are collectively performed, and therefore a high-speed and small-scale circuit can be implemented.

Further, the error-correction control circuit 312 detects an error position by using the syndrome s output by the syndrome calculation circuit 311a. In this case, in the error-correction circuit 310, the syndrome calculation circuit 311 can be implemented with high speed and reduced circuit size, and therefore the high-speed and small-scale error-correction circuit 310 can also be implemented.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A syndrome calculation circuit comprising:
a matrix product calculation circuit configured to generate syndrome bits in a composite field by calculating a matrix product of input data bits and a first arithmetic matrix, wherein
the first arithmetic matrix is a matrix product of a basis conversion matrix for converting a data string from a Galois field to the composite field and a second arithmetic matrix, which is at least a part of a parity check matrix.

2. The syndrome calculation circuit according to claim 1, wherein the second arithmetic matrix is the parity check matrix.

3. The syndrome calculation circuit according to claim 1, wherein the second arithmetic matrix is a part of, and not an entirety, of the parity check matrix.

4. The syndrome calculation circuit according to claim 1, wherein the matrix product calculation circuit consists of only one circuity configured to perform matrix product calculation.

5. An error detection circuit comprising:
the syndrome calculation circuit according to claim 1; and
an error detection control circuit configured to perform error detection of the input data bits based on the syndrome bits.

6. An error correction circuit comprising:
the syndrome calculation circuit according to claim 1; and
an error correction control circuit configured to perform error detection and error correction of the input data bits based on the syndrome bits.

7. The syndrome calculation circuit according to claim 1, further comprising:
an adder circuit configured to perform logical addition processing with respect to each bit;
a register configured to store an output of the adder circuit; and
a second matrix product calculation circuit configured to calculate a second matrix product of the output stored in the register and a third arithmetic matrix, the third arithmetic matrix being a matrix product of the basis conversion matrix, a shift matrix corresponding to multiplication of elements of an integer power of primitive elements in the Galois field, and a second basis conversion matrix for converting a data string from the composite field to the Galois field.

8. An error detection circuit comprising:
the syndrome calculation circuit according to claim 7; and
an error detection control circuit configured to perform error detection of the input data bits based on the syndrome bits.

9. An error correction circuit comprising:
the syndrome calculation circuit according to claim 7; and
an error correction control circuit configured to perform error detection and error correction of the input data bits based on the syndrome bits.

10. A memory system comprising:
a non-volatile memory; and
a memory controller including a controller circuit configured to control reading of data from the non-volatile memory and an error correction circuit, the error correction circuit including a syndrome calculation circuit and an error correction control circuit, wherein
the controller circuit inputs data bits based on data read from the non-volatile memory,
the syndrome calculation circuit generates syndrome bits in a composite field by calculating a matrix product of the input data bits and a first arithmetic matrix, wherein the first arithmetic matrix is a matrix product of a basis conversion matrix for converting a data string from a Galois field to the composite field and a second arithmetic matrix, which is at least a part of a parity check matrix,
the error correction control circuit performs error detection and error correction of the input data bits based on the syndrome bits, and
the controller circuit outputs error-corrected data bits to a host.

11. The memory system according to claim 10, wherein the second arithmetic matrix is the parity check matrix.

12. The memory system according to claim 10, wherein the second arithmetic matrix is a part of, and not an entirety, of the parity check matrix.

13. The memory system according to claim 10, wherein the syndrome calculation circuit consists of only one circuity configured to perform matrix product calculation.

14. The memory system according to claim 10, wherein the syndrome calculation circuit further includes:
an adder circuit configured to perform logical addition processing with respect to each bit;
a register configured to store an output of the adder circuit; and
a second matrix product calculation circuit configured to calculate a second matrix product of the output stored in the register and a third arithmetic matrix, the third arithmetic matrix being a matrix product of the basis conversion matrix, a shift matrix corresponding to multiplication of elements of an integer power of primitive elements in the Galois field, and a second basis conversion matrix for converting a data string from the composite field to the Galois field.

* * * * *